US009608097B2

(12) United States Patent
Eklund

(10) Patent No.: US 9,608,097 B2
(45) Date of Patent: Mar. 28, 2017

(54) INSULATED GATE BIPOLAR TRANSISTOR AMPLIFIER CIRCUIT

(71) Applicant: K. EKLUND INNOVATION, Uppsala (SE)

(72) Inventor: Klas-Hakan Eklund, Uppsala (SE)

(73) Assignee: K.EKLUND INNOVATION, Uppsala (SE)

( * ) Notice: Subject to any disclaimer, the term of this patent is extended or adjusted under 35 U.S.C. 154(b) by 0 days.

(21) Appl. No.: 14/889,876

(22) PCT Filed: May 12, 2014

(86) PCT No.: PCT/SE2014/050577
§ 371 (c)(1),
(2) Date: Nov. 9, 2015

(87) PCT Pub. No.: WO2014/185852
PCT Pub. Date: Nov. 20, 2014

(65) Prior Publication Data
US 2016/0093723 A1    Mar. 31, 2016

(30) Foreign Application Priority Data
May 16, 2013 (SE) ...................... 1350595

(51) Int. Cl.
*H01L 29/73* (2006.01)
*H01L 29/739* (2006.01)
(Continued)

(52) U.S. Cl.
CPC ........ *H01L 29/7393* (2013.01); *H01L 23/535* (2013.01); *H01L 27/0623* (2013.01);
(Continued)

(58) Field of Classification Search
CPC ............. H01L 29/7393; H01L 29/0847; H01L 29/1008; H01L 29/1095; H01L 29/0808;
(Continued)

(56) References Cited

U.S. PATENT DOCUMENTS 4,859,878 A   8/1989 Murayama
5,126,806 A   6/1992 Sakurai et al.
(Continued)

FOREIGN PATENT DOCUMENTS

EP   0 594 111 A1   4/1994
WO   2009/123559 A1   10/2009

OTHER PUBLICATIONS

Bakeroot et al., "A New Lateral-IGBT Structure with a Wider Safe Operating Area," IEEE Electron Device Letters, vol. 28, No. 5, May 2007, p. 416-418.
Tee et al., "A Review of techniques used in Lateral Insulated Gate Bipolar Transistor (LIGBT)," IOSR Journal of Electrical and Electronics Engineering (IOSR-JEEE), vol. 3, issue 1, Nov.-Dec. 2012, pp. 35-52.
(Continued)

*Primary Examiner* — Roy Potter
*Assistant Examiner* — Paul Patton
(74) *Attorney, Agent, or Firm* — Young & Thompson

(57) ABSTRACT

The present invention provides a lateral IGBT transistor comprising a bipolar transistor and an IGFET. The lateral IGBT comprises a low resistive connection between the drain of the IGFET and the base of the bipolar transistor, and an isolating layer arranged between the IGFET and the bipolar transistor. The novel structure provides a device which is immune to latch and gives high gain and reliability. The structure can be realized with standard CMOS technology available at foundries.

13 Claims, 3 Drawing Sheets

(51) Int. Cl.
*H01L 23/535* (2006.01)
*H01L 29/06* (2006.01)
*H01L 29/08* (2006.01)
*H01L 29/10* (2006.01)
*H01L 27/06* (2006.01)

(52) U.S. Cl.
CPC ...... *H01L 29/0649* (2013.01); *H01L 29/0808* (2013.01); *H01L 29/0821* (2013.01); *H01L 29/0847* (2013.01); *H01L 29/1008* (2013.01); *H01L 29/1033* (2013.01); *H01L 29/1095* (2013.01); *H01L 2924/0002* (2013.01)

(58) Field of Classification Search
CPC ............. H01L 29/0821; H01L 29/1033; H01L 29/0649; H01L 23/535
See application file for complete search history.

(56) References Cited

U.S. PATENT DOCUMENTS

| | | |
|---|---|---|
| 5,708,287 A | 1/1998 | Nakagawa et al. |
| 5,869,850 A | 2/1999 | Endo et al. |
| 2005/0110097 A1 | 5/2005 | Chen |
| 2010/0219446 A1* | 9/2010 | Chen ............... H01L 27/0705 257/139 |

OTHER PUBLICATIONS

International Search Report, dated Sep. 12, 2014, from corresponding PCT application.
European Search Report, dated Jan. 4, 2017, from corresponding European Patent Application No. EP 14798633.

\* cited by examiner

INSULATED GATE BIPOLAR TRANSISTOR AMPLIFIER CIRCUIT

TECHNICAL FIELD

The present invention relates to an insulated gate bipolar transistor (IGBT) device. In particular, the present invention relates to a hybrid form of semiconductor devices combining a field effect transistor with a bipolar transistor.

BACKGROUND OF THE INVENTION

Over the recent years a growing interest has been seen in the area of highly integrated semiconductor device that can be used for power management and signal amplification.

U.S. Pat. No. 5,126,806 describes a lateral insulated gate bipolar transistor (IGBT), Ref. 1, which is particularly well suited for high power switching applications. Disclosed is an enhancement-IGFET device having its source and drain electrodes connected to the base and emitter, respectively, of a lateral bipolar transistor. When an appropriate gate input voltage, here in the form of a positive charge, is applied to the IGFET, the channel conducts, thus biasing the bipolar transistor into conduction. The applied charge on the gate electrode can be used to control a large current through the bipolar device, which is of particular interest in power applications. Safe switching operation at high voltages however requires a very wide base and a low gain in the bipolar transistor. Various forms of said devices have been integrated in modern CMOS processes as described by Bakeroot et. al. in IEEE EDL-28, pp. 416-418, 2007, Ref. 2. Relevant in this context is also a report by E. Kho Ching Tee entitled "A review of techniques used in Lateral Insulated Gate Bipolar Transistor (LIGBT)" in Journal of Electrical and Electronics Engineering, vol. 3, pp. 35-52, 2012, Ref. 3. While this type of device is potentially quite useful for various forms of power switching, with its requirements of high voltage capability and low internal gain, it is disadvantageous for a device incorporated in a low voltage highly integrated circuit intended for power management and signal amplification.

FIG. 1A shows one example of prior art in the form of a lateral insulated gate bipolar transistor device (LIGBT) such as described in U.S. Pat. No. 5,126,806 by Sakurai et. al. mentioned above. The integrated device 30 is constructed in a low-doped n-type layer 35 containing a p-type doped layer 50 with a higher impurity concentration than that of the n-type layer and a p+ layer 70 with an impurity concentration exceeding that of the p-type doped layer 50. In the p-doped layer 50 is provided an n+-layer 60 with an impurity concentration that is higher than that of the p-type layer 50. The p-doped layer 50 and the n+-layer 60 are electrically short-circuited by an emitter electrode 55. A collector electrode 65 forms an ohmic contact to the p+-layer 70. An insulating film serves as gate dielectric 40 and separates the gate electrode 45 from the substrate.

When a positive potential is applied to the gate electrode 45, the conductivity of a surface portion of the p-layer 50 under the gate dielectric 40 is inverted to form an n-type channel. Electrons from the n+-layer 60 can then pass through the channel from the n-layer 35 to the p+-layer 70 from which positive holes are injected. Thereby the n-layer 35, having a high resistivity, is conductivity-modulated to provide a low resistance path between the anode (C) and cathode (E) in FIG. 1A. A low on-resistance and excellent forward blocking characteristic can thus be realized, which is quite useful for various forms of power switching.

Numerous modifications of the above described embodiment, with emphasis on improved switching performance, exist, some of which are covered in a report entitled "A review of techniques used in Lateral Insulated Gate Bipolar Transistor (LIGBT)" by E. Kho Ching Tee published in Journal of Electrical and Electronics Engineering, vol. 3, pp. 35-52, 2012.

FIG. 1B, is an equivalent electrical circuit diagram for the device in FIG. 1A. Shown are the three terminals, C, E and G. The device also utilizes an external back-side substrate electrode. The n-type IGFET has its source and body terminals strapped together at (E) and these are, in turn, connected to the collector layer (C) of the lateral bipolar pnp-transistor over the body resistance, R1. Shown is also how the base terminal of the lateral pnp-transistor is connected to the drain of the IGFET over a variable resistance, R2, the latter mirroring the conductivity modulation.

A vertical parasitic npn-transistor that has its base connected to the collector of the lateral pnp-transistor is included in FIG. 1B to illustrate that the LIGBT contains a thyristor-like structure. Once this thyristor causes latch-up, the LIGBT device can no longer be controlled by the gate potential. The condition for latch-up is: $\alpha_{npn}+\alpha_{pnp} \geq 1$, where $\alpha_{npn}$ and $\alpha_{pnp}$ are the common-base current gains of the parasitic npn transistor and pnp transistor, respectively. To reduce the risk for latch-up it is essential to lower the current gain $\alpha$ in both transistors. Since the pnp transistor carries the on-state voltage drop, the gain of the npn-transistor has to be suppressed by, e.g., increasing the base doping below the emitter layer (lowering the base resistance).

SUMMARY OF THE INVENTION

Obviously prior art hybrid semiconductor devices need to be improved, particularly with regards to the latch-up, in order to be commercially attractive as amplifying circuits.

The object of the present invention is to provide an IGBT device that overcomes the drawback of the prior art devices. This is achieved by the device as defined in claim 1.

A lateral IGBT transistor is provided comprising a bipolar transistor and an IGFET having a low resistive connection between the drain of the IGFET and the base of the bipolar transistor and an isolating layer arranged between the IGFET and the bipolar transistor, thereby providing latch immunity.

According to one embodiment of the invention the lateral IGBT transistor is a lateral n-channel IGBT transistor comprising a bipolar pnp transistor and a n-channel IGFET. The lateral n-channel IGBT transistor comprises a semiconductor substrate, and an insulating layer buried in the semiconductor substrate and at least covering the bipolar pnp transistor. The bipolar pnp transistor comprises:

a p-type collector layer arranged on top of a portion of insulating layer and extending to the upper surface of the semiconductor substrate, forming the collector of the bipolar pnp transistor;

an n-type base layer arranged within the p-type collector layer and extending to the upper surface of the semiconductor substrate, forming the base of the bipolar pnp transistor; and, a p-type emitter layer arranged within n-type base layer and extending to the upper surface of the semiconductor substrate, forming the emitter of the bipolar pnp transistor.

The n-channel IGFET comprises:

a p-well extending from the upper surface of the semiconductor substrate into the semiconductor substrate;

a channel layer in vicinity of the upper surface of the semiconductor substrate and arranged under a gate structure;

an n-type source layer forming the source of the n-channel IGFET; and an n-type drain layer forming the drain of the n-channel IGFET.

According to the embodiment the lateral n-channel IGBT transistor is provided with:

an n-well layer adjacent to the p-well of the n-channel IGFET and to the collector layer of the bipolar pnp transistor. The n-type base layer is enclosed by the collector layer. The n-well layer surrounds the collector layer and is in contact with insulating layer, providing device isolation of the bipolar pnp transistor, a low resistive interconnect layer extending from the drain layer to the base layer forming low resistive interconnect and simultaneously providing an ohmic contact to the base layer. The low resistive interconnect layer is arranged at least partly over the p-well and at least partly over the collector layer and at least partly over the n-well layer.

According to another embodiment of the invention the lateral IGBT transistor is a lateral p-channel IGBT transistor comprising a bipolar npn transistor and a p-channel IGFET.

The lateral p-channel IGBT transistor comprises a semiconductor substrate and a buried n-layer arranged in the semiconductor substrate at least covering the bipolar npn transistor and at least portion of a drain layer of the IGFET.

The bipolar npn transistor comprises:

an n-type collector layer arranged on top of a portion of the buried n-layer and a portion extending to the upper surface of the semiconductor substrate, forming the collector of the bipolar npn transistor;

a p-type base layer arranged within the n-type collector layer and extending to the upper surface of the semiconductor substrate, forming the base of the bipolar npn transistor; and an n-type emitter layer arranged within base layer and extending to the upper semiconductor substrate, forming the emitter of the bipolar npn transistor.

The p-channel IGFET comprises:

an n-well extending from the upper surface of the semiconductor substrate into the semiconductor substrate;

a channel layer in vicinity of the upper surface of the semiconductor substrate and arranged under a gate structure;

a p-type source layer is forming the source of the p-channel IGFET; and a p-type drain layer forming the drain of the p-channel IGFET.

According to the embodiment the lateral p-channel IGBT transistor is provided with:

a p-well layer adjacent to the p-well of the p-channel IGFET and to the collector layer of the bipolar npn transistor. The p-type base layer is enclosed by the collector layer and the p-well layer surrounds the collector layer and is in contact with the buried n-layer providing device isolation between the IGFET and the npn bipolar transistor;

a low resistive interconnect layer extending from the drain layer to the base layer forming low resistive interconnect and simultaneously providing an ohmic contact to the base layer.

The low resistive interconnect layer is arranged at least partly over the n-well, at least partly over the collector layer and at least partly over the p-well layer.

According to a further embodiment the semiconductor substrate of the lateral IGBT transistor comprises a buried oxide layer and the insulating layer is formed by the oxide layer that extends over the complete substrate.

According to a further embodiment the interconnect layer of the lateral IGBT transistor is provided with openings to allow contact to the collector layer.

According to yet a further embodiment the interconnect layer $136c$ is shunted by a silicide layer of low resistivity.

According to yet a possible further embodiment the interconnect layer is replaced by a metal bridge spanning from drain layer of the IGFET to base layer of the bipolar transistor.

If the interconnect layer is replaced by a metal bridge layer 130 in FIG. 2 it may be connected to the highest potential which is the potential at the emitter layer 145 instead of following the varying base potential with a lot of capacitance variations. Further layer $125a$ can be withdrawn from layer 120.

For the p-channel device in FIG. 3 layer 220 can be withdrawn from layer $230a$ so that layer 225 will be in contact with the substrate 115 and normally be at ground potential.

According to yet a further embodiment the lateral IGBT transistor is provided with oxide isolation layers surrounding the emitter and the collector contact layers.

Latch-up immunity is a key performance advantage and is related to the killed gain of the lateral pnp-transistor in e.g. FIG. 2 where layer 145 is the emitter layer, $136c$ is the base layer and 125 is the collector layer. The low resistance of the base layer will effectively kill the gain of the transistor and related collector current will be zero.

This will also prevent layer 135 from being forward biased against layer $125a$ which is the first step to latch-up. This will also drastically reduce substrate current which is another key performance advantage.

The latch-up immunity will allow the gain of the bipolar transistor 102 to be optimized for very high gain typically 100-500.

The bipolar transistor 102 can further optionally drive the base of an npn-transistor like 202 in a Darlington connection where the gains are multiplied to be well over 10000.

With this internal amplification the device can be used for power management and signal amplification and many other types of electronic circuits as near field communication, opto electronics and charge detection in sensor applications.

Further the n-channel device in FIG. 2 can easily be combined on the same chip with the p-channel device in FIG. 3.

To further improve voltage capability for e.g. power management the IGFET could be of the extended drain type.

In the preferred embodiment the device can be realised in a standard low-voltage CMOS process as provided by foundries.

And can therefore easily be combined with standard CMOS logic and analogue functions.

BRIEF DESCRIPTION OF THE DRAWINGS

While the novel features of the invention are set forth with particularity in the appended claims, the invention, both as to organization and content, will be better understood and appreciated from the following detailed description and drawings, in which:

DETAILED DESCRIPTION

The present invention will now be explained with the help of the accompanying drawings which show embodiments thereof.

Figure 2:
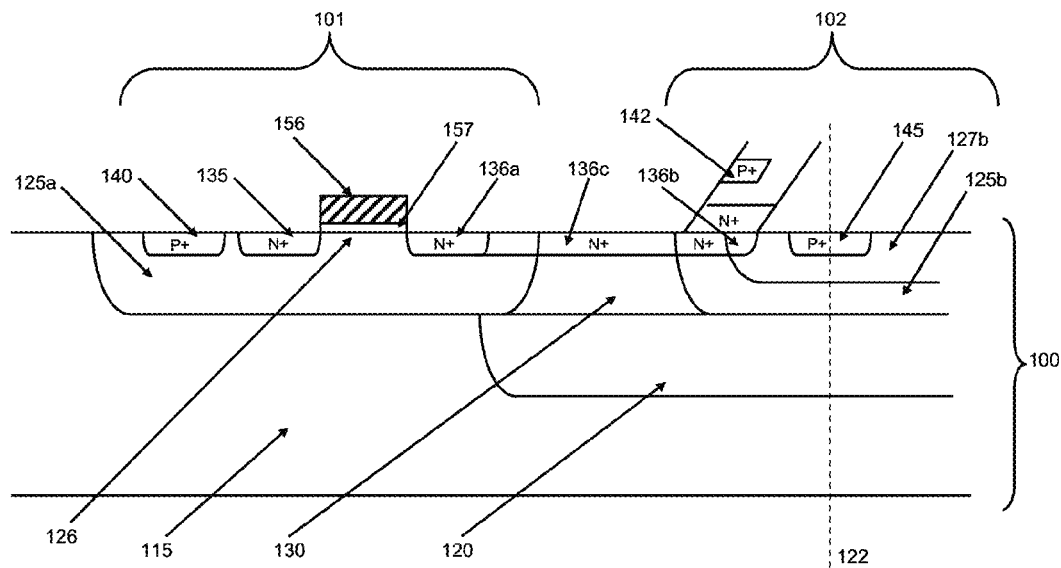
FIG. 2 illustrates schematically the structure of a first embodiment of the IGBT according to the present invention.

In FIG. 2 is shown a preferred embodiment of a lateral N-channel IGBT transistor 100 which easily can be combined with state of the art CMOS technology. Said IGBT consists of an IGFET transistor 101 that is electrically connected to the base of a bipolar pnp transistor 102 as described below.

The substrate 115 consists of a silicon wafer with or without an epi layer on top. Said substrate 115 is preferably of (100)-orientation. Substrate 115 can also, in an embodiment of the invention, be a Silicon-On-Insulator (SOI) substrate. In case an SOI substrate is used layer 120 is omitted.

Within a part of the substrate a buried n-type layer 120 with a typical thickness in the order of 1 μm and a typical doping concentration in the range of $1.10^{17}$ to $1.10^{19}$ cm$^{-3}$ is formed. On top of a part of layer 120, a p-type layer 125$b$ is formed that reach the surface. Said layer 125$b$ has a thickness around 0.6 μm and a doping concentration around $1.10^{18}$ cm$^{-3}$. The layer 125$b$ will form the collector of the bipolar pnp transistor.

Within layer 125$b$ an n-type layer 127$b$ is formed that reach the surface and forms the base of the bipolar pnp transistor. The n-type base layer 127$b$ has a doping concentration in the range of $5.10^{17}$ to $5.10^{18}$ cm$^{-3}$ and the base-collector junction is approximately 0.3 μm below surface. Said n-type base layer 127$b$ is enclosed by the collector layer 125$b$. Within layer 127$b$ a p+-layer 145 which reach the surface is formed. The junction depth of said p+ layer is approximately 0.2 μm and the layer has a typical surface doping concentration of $5.10^{19}$ cm$^{-3}$. Said layer, which is enclosed by the base layer 127$b$, forms the emitter of the bipolar pnp transistor.

The n-type IGFET transistor is located in the p-well 125$a$ with its channel layer 126 in vicinity of the semiconductor surface, right under the gate structure 156. The n+-layer 135 is forming the source of the IGFET and the n+-layer 136$a$ the drain of the IGFET. The junction depths of said n+-layers are approximately 0.2 μm and the layers have typical surface concentrations in the range of $5.10^{19}$ to $1.10^{2C}$ cm$^{-3}$. A p+-layer 140 with a typical junction depth of 0.2 μm and a typical surface doping concentration of $5.10^{19}$ cm$^{-3}$ will serve as substrate contact.

The n-type IGFET is separated from the Bipolar transistor by an n-type layer 130 that is placed on top of, and makes contact to, layer 120. Said layer reaches the surface and vertically surrounds the p-type layer 125$b$ that forms the collector of the pnp transistor. The thickness of said layer is approximately 0.4 μm and the doping concentration is around $1.10^{18}$ cm$^{-3}$. On top of layer 130 is a low resistive interconnect layer 136$c$ arranged that extends into layers 125$a$ and 125$b$ to interconnect layers 136$a$ and 136$b$, forming respective drain and base contact layers of the devices.

Figure 3:
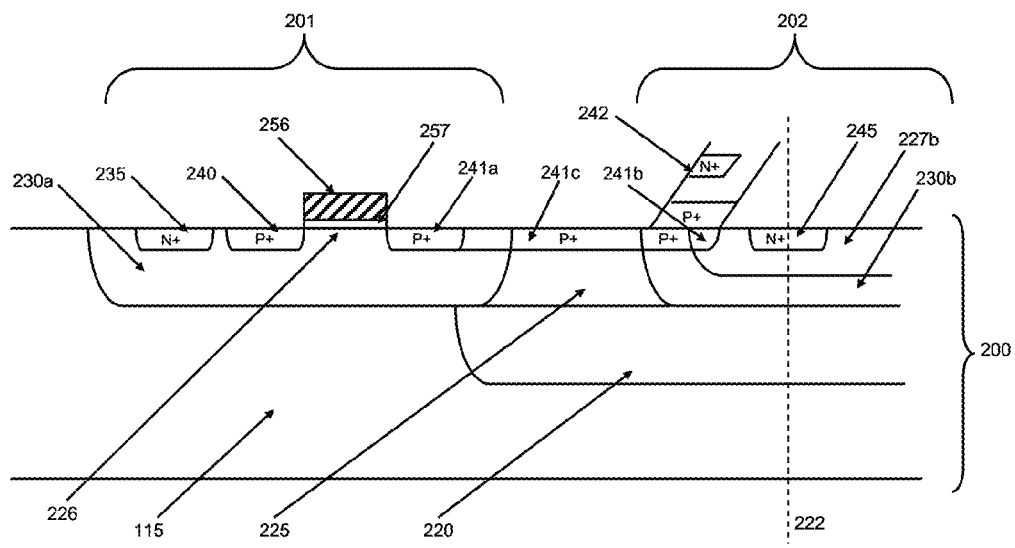
FIG. 3 illustrates schematically the structure of a second embodiment of the IGBT according to the present invention.

The layer 130 will isolate the bipolar pnp transistor from the substrate together with layer 120. The highly doped drain layer 136$a$ forms an ohmic contact to the IGFET and the highly doped layer 136$b$ forms an ohmic contact to the base layer 127$b$ of the pnp-transistor, where layer 145 is the emitter and layer 125$b$ is the collector. The n+-layer 136$c$ contain openings before reaching layer 125$b$ leaving space for contacting the collector layer with a p+-layer, 142. The surface of said interconnect layer is preferably shunted by a silicide layer (e.g. TiSi$_2$, CoSi$_2$, NiSi) of low resistivity. As indicated in FIG. 2, the p-layer 125$a$, the contact p+-layer 140, the n+-source 135, the gate electrode 156 and drain layer 136$a$ can be mirrored in the vertical plane 122 through the emitter. For about the preferred embodiment of the device in FIG. 2 a gain more than 100 has been verified with a base-width of around 0.4 μm which means there is a lot of room for improvements. In FIG. 3 is shown a preferred embodiment of a lateral P-channel IGBT transistor 200 which easily can be combined with state of the art CMOS technology. Said IGBT consists of a p-type IGFET transistor 201 that is electrically connected to the base of a bipolar npn transistor 202 as described below.

The device comprises a p-type silicon substrate 115 as described above. Within a part of the substrate a buried n-type layer 220 with a typical thickness in the order of 1 μm and a typical doping concentration in the range of $1·10^{17}$ to $1·10^{19}$ cm$^{-3}$ is formed. On top of a part of layer 220, an n-type layer 230$b$ is formed that reaches the surface. Said layer 230$b$ has a thickness around 0.4 μm and a doping concentration around $1.10^{18}$ cm$^{-3}$. The layer 230$b$ will form the collector of the bipolar npn transistor.

Within layer 230$b$ a p-type layer 227$b$ is formed that reaches the surface and forms the base of the bipolar npn transistor. The p-type base layer 227$b$ has a doping concentration in the range of $5.10^{17}$ to $5.10^{18}$ cm$^{-3}$ and the base-collector junction is approximately 0.4 μm below surface. Said p-type base layer 227$b$ is enclosed by the collector layer 230$b$.

Within layer 227$b$ an n+-layer 245 which reaches the surface is formed. The junction depth of said n+ layer is approximately 0.2 μm and the layer has a typical surface doping concentration of $1.10^{20}$ cm$^{-3}$. Said layer, which is enclosed by the base layer 227$b$, forms the emitter of the bipolar npn transistor.

The p-type IGFET transistor is located in the n-well 230$a$ with its channel layer 226 in vicinity of the semiconductor surface, right under the gate structure 256. The p+-layer 240 is forming the source of the IGFET and the p+-layer 241$a$ the drain of the IGFET. The junction depths of said p+-layers are approximately 0.2 μm and the layers have typical surface concentrations in the range of $1.10^{19}$ to $5.10^{19}$ cm$^{-3}$. An n+-layer 235 with a typical junction depth of 0.2 μm and a typical surface doping concentration of $1.10^{2C}$ cm$^{-3}$ will serve as body contact to the p-type IGFET transistor and as contact to the n-layer 230$a$. Said n-layer 230$a$, which reaches the surface, has an approximate depth of 0.4 μm and an approximate doping concentration of $1.10^{18}$ cm$^{-3}$. Said layer makes contact to layer 220 and leaves space for a p-well 225, on top of layer 220, between layers 230$a$ and 230$b$.

On top of layer 225 is a highly conductive layer 241$c$ arranged that interconnect layers 241$a$ and 241$b$ that forms respective drain and base contacts of the devices. The highly conductive layer 241$c$ arranged on top of layer 225 extends into layers 230a and 230b to interconnect layers 241a and 241b, forming respective drain and base contact layers of the devices.

The highly doped drain layer 241a forms an ohmic contact to the IGFET and the highly doped layer 241b forms an ohmic contact to the base layer 227b of the npn-transistor, where layer 245 is the emitter and layer 230b is the collector. The p+-layer 241c contain openings before reaching layer 230b leaving space for contacting the collector layer with an n+-layer, 242. The surface of said interconnect layer is preferably shunted by a silicide layer (e.g. $TiSi_2$, $CoSi_2$, NiSi) of low resistivity. As indicated in FIG. 3, the n-layer 230a, the contact n+-layer 235, the p+-source 240, the gate electrode 256 and drain layer 241a can be mirrored in the vertical plane 222 through the emitter.

Figure 4:
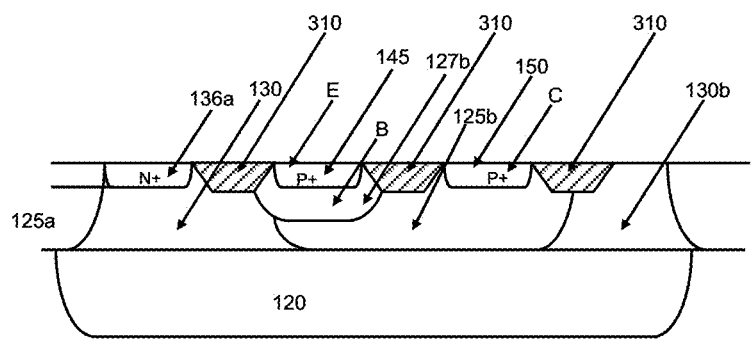
FIG. 4 illustrates schematically the structure of a third embodiment of the IGBT according to the present invention.

In FIG. 4 is shown an alternative preferred embodiment of a lateral N-channel IGBT transistor which use STI (Shallow Trench Isolation) layers 310, for oxide isolation. These layers are about 0.3 µm deep and improve isolation between n+- and p+-layers this step can easily be combined with state of the art CMOS technology. Just the bipolar side of the device is shown. In FIG. 4 the reference numerals designate same parts as those already shown in FIG. 2.

The substrate 115 consists of a silicon wafer with or without an epi layer on top. Said substrate 115 is preferably of (100)-orientation. Substrate 115 can also, in an embodiment of the invention, be a Silicon-On-Insulator (SOI) substrate.

Within a part of the substrate a buried n-type layer 120 with a typical thickness in the order of 1 µm and a typical doping concentration in the range of $1.10^{17}$ to $1.10^{19}$ cm$^{-3}$ is formed. On top of a part of layer 120, a p-type layer 125b is formed that reaches the surface. Said layer 125b has a thickness around 0.4 µm and a doping concentration around $1.10^{18}$ cm$^{-3}$. The layer 125b will form the collector of the bipolar pnp transistor.

Partly within layer 125b an n-type layer 127b is formed that reach the surface and forms the base of the bipolar pnp transistor. The n-type base layer 127b has a doping concentration in the range of $5.10^{17}$ to $5.10^{18}$ cm$^{-3}$ and the base-collector junction is approximately 0.4 µm below surface. Said n-type base layer 127b is not fully enclosed by the collector layer 125b. Within layer 127b a p+-layer 145 which reaches the surface is formed. The junction depth of said p+ layer is approximately 0.2 µm and the layer has a typical surface doping concentration of $5.10^{19}$ cm$^{-3}$. Said layer, which is enclosed by the base layer 127b, forms the emitter of the bipolar pnp transistor.

The n-type IGFET, not shown, is separated from the Bipolar transistor by an n-type layer 130 that is placed on top of, and makes contact to, layer 120. Said layer reaches the surface and vertically surrounds the p-type layer 125b that forms the collector of the pnp transistor. The thickness of said layer is approximately 0.4 µm and the doping concentration is around $1.10^{18}$ cm$^{-3}$. This layer will isolate the bipolar pnp transistor from the substrate together with layer 120. The somewhat longer highly doped drain layer 136a will form an ohmic contact to the n-layer 130 and thus to the base layer 127b of the pnp-transistor, where layer 145 is the emitter and layer 125b is the collector. The surface of said interconnect layer 136a is preferably shunted by a silicide layer (e.g. $TiSi_2$, $CoSi_2$, NiSi) of low resistivity.

Figure 5:
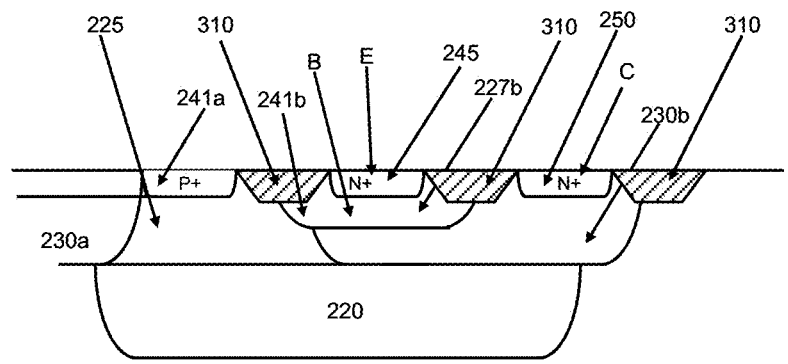
FIG. 5 illustrates schematically the structure of a fourth embodiment of the IGBT according to the present invention.

In FIG. 5 is shown an alternative preferred embodiment of a lateral P-channel IGBT transistor which use STI (shallow Trench Isolation) layers 310, for oxide isolation. These layers are about 0.3 µm deep and improve isolation between n+- and p+-layers, see FIG. 5 layers 310. This step can easily be combined with state of the art CMOS technology. In FIG. 5 the reference numerals designate same parts as those already shown in FIG. 2.

The device comprises a p-type silicon substrate 115 as described above. Within a part of the substrate a buried n-type layer 220 with a typical thickness in the order of 1 µm and a typical doping concentration in the range of $1.10^{17}$ to $1.10^{19}$ cm$^{-3}$ is formed. On top of a part of layer 220, an n-type layer 230b is formed that reach the surface. Said layer 230b has a thickness around 0.4 µm and a doping concentration around $1.10^{18}$ cm$^{-3}$. The layer 230b will form the collector of the bipolar npn transistor.

Within layer 230b a p-type layer 227b is formed that reaches the surface and forms the base of the bipolar npn transistor. The p-type base layer 227b has a doping concentration in the range of $5.10^{17}$ to $5.10^{18}$ cm$^{-3}$ and the base-collector junction is approximately 0.4 µm below the surface. Said p-type base layer 227b is not fully enclosed by the collector layer 230b.

Within layer 227b an n+-layer 245 which reaches the surface is formed. The junction depth of said n+-layer is approximately 0.2 µm and the layer has a typical surface doping concentration of $1.10^{2C}$ cm$^{-3}$. Said layer, which is enclosed by the base layer 227b, forms the emitter of the bipolar npn transistor.

The p-type IGFET transistor is located in the n-well 230a with its channel layer 236 in vicinity of the semiconductor surface, right under the gate structure 256. The p+-layer 240 is forming the source of the IGFET and the p+-layer 241a the drain of the IGFET. The junction depths of said p+ layers are approximately 0.2 µm and the layers have typical surface concentrations in the range of $1.10^{19}$ to $5.10^{19}$ cm$^{-3}$. An n+-layer 235 with a typical junction depth of 0.2 µm and a typical surface doping concentration of $1.10^{2C}$ cm$^{-3}$ will serve as body contact to the p-type IGFET transistor and as contact to the n-layer 230a. Said n-layer 230a, which reaches the surface, has an approximate depth of 0.4 µm and an approximate doping concentration of $1.10^{18}$ cm$^{-3}$. Said layer makes contact to layer 220 and leaves space for a p-well 225, on top of layer 220, between layers 230a and 230b.

The somewhat longer highly doped drain layer 241a, that extends into layer 225 will form an ohmic contact 241b to the base layer 227b of the npn-transistor, where layer 245 is the emitter and layer 230b is the collector. The surface of said interconnect layer is preferably shunted by a silicide layer (e.g. $TiSi_2$, $CoSi_2$, NiSi) of low resistivity.

Figure 1A:
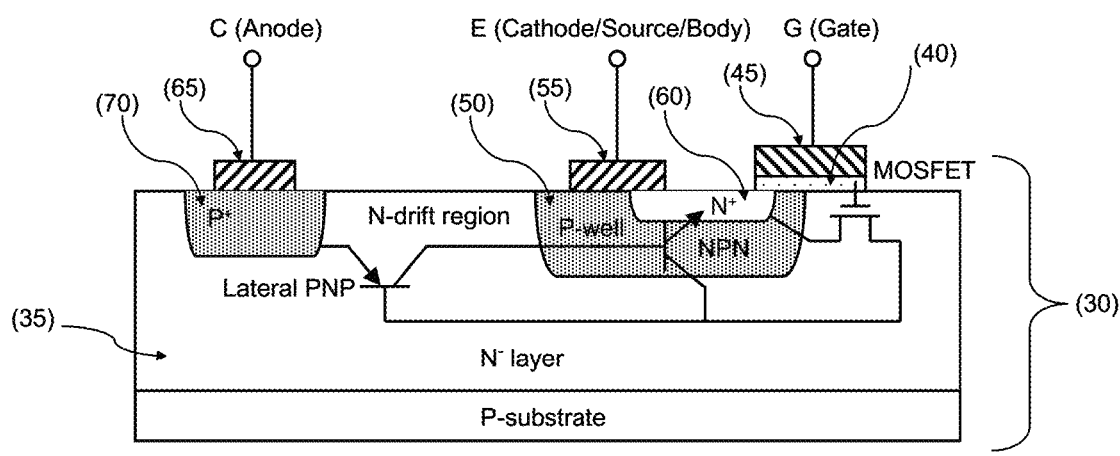
FIG. 1A is a sectional side view depicting a representative prior art lateral insulated gate bipolar transistor (LIGBT)
Figure 1B:
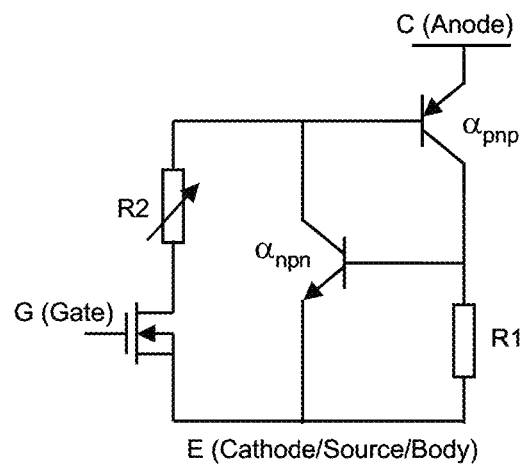
FIG. 1B is the equivalent circuit of the prior-art device in FIG. 1A.

The described devices and functions that have been detailed above as part of the invention are very different from the prior art device of FIG. 1A, in that the drift layer 20 has in our embodiments been replaced by a somewhat extended drain diffusion having a very low resistivity, typically 20 ohm/square, as compared to the high resistivity, typically 10 kohm, of the prior art drift layer. Conductivity modulation, being an essential function of prior-art devices, will therefore not occur. Furthermore, in contrast to the prior art devices, the transistor structures implemented in the invention are all of standard type and do not require special processing and layout steps and modifications. The use of a vertical bipolar transistor in combination with a lateral IGFET and the elimination of any lateral pnp- and/or npn-transistor(s), the latter being an essential part of prior art devices, reduce the risk of latch-up problems and distinguishes our invention from prior art.

REFERENCES

[1] N. Sakurai, M. Mori, T. Tanaka, "U.S. Pat. No. 5,126,806"
[2] B. Bakeroot, J. Doutreloigne, P. Vanmeerbeek, P. Moens, "A New Lateral-IGBT Structure with a Wider Safe Operating Area", IEEE Electron Device Letters 28, 416-418 (2007).
[3] E. K. C. Tee, A. Holke, S. J. Pilkington, D. K. Pal, N. L. Yew, so W. A. W. Z. Abidin, "A Review of techniques used in Lateral Insulated Gate Bipolar Transistors (LIGBT)".

The invention claimed is:

1. A lateral IGBT transistor comprising a bipolar transistor and an IGFET, where the IGFET can be of conventional type or be of the extended drain type, characterized by:
    a low resistive connection between the drain of the IGFET and the base of the bipolar transistor, and;
    an isolating layer arranged between the IGFET and the bipolar transistor,
    thereby providing latch immunity,
    wherein the lateral IGBT transistor is a lateral n-channel IGBT transistor (100) comprising a bipolar PNP transistor (102) and a n-channel IGFET (101), wherein the lateral n-channel IGBT transistor (100) comprises:
        a semiconductor substrate (115); and
        an insulating layer (120) buried in the semiconductor substrate and at least covering the bipolar PNP transistor and at least portion of a drain layer (136a) of the IGFET;
    and wherein the bipolar PNP transistor (102) comprises:
        a p-type collector layer (125b) arranged on top of a portion of insulating layer (120) and extending to the upper surface of the semiconductor substrate (115), forming the collector of the bipolar PNP transistor;
        an n-type base layer (127b) arranged within the p-type collector layer (125b) and extending to the upper surface of the semiconductor substrate (115), forming the base of the bipolar PNP transistor; and
        a p-type emitter layer (145) arranged within n-type base layer (127b) and extending to the upper surface of the semiconductor substrate (115), forming the emitter of the bipolar PNP transistor;
    and wherein the n-channel IGFET comprises:
        a p-well (125a), extending from the upper surface of the semiconductor substrate (115) into the semiconductor sub-strate (115);
        a channel layer (126) in vicinity of the upper surface of the semiconductor substrate (115) and arranged under a gate structure (156),
        an n-type source layer (135) forming the source of the n-channel IGFET (101); and
        an n-type drain layer (136a) forming the drain of the n-channel IGFET (101);
    the lateral n-channel IGBT transistor (100) characterized by:
        an n-well layer (130) adjacent to the p-well (125a) of the n-channel IGFET (101) and to the collector layer (125b) of the bipolar PNP transistor (102), and wherein the n-type base layer (127b) is enclosed by the collector layer (125b), and the n-well layer (130) surrounds the collector layer (125b) and is in contact with the insulating layer (120), providing device isolation of the bipolar PNP transistor (102); and
        a low resistive interconnect layer (136c) extending from the drain layer (136a) to the base layer (136b) forming low resistive interconnect and simultaneously providing an ohmic contact to the base layer (136b), the low resistive interconnect layer (136c) arranged at least partly over the p-well (125a) and at least partly over the collector layer (125b) and at least partly over the n-well layer (130).

2. The lateral N-channel IGBT transistor (100) according to claim 1, characterized in that the semiconductor substrate (115) comprises buried oxide layer and the insulating layer (120) is formed by the oxide layer that extends over the complete substrate.

3. The lateral N-channel IGBT transistor (100) according to claim 1, characterized in that the interconnect layer (136c) is provided with openings to allow contact to the collector layer (125b).

4. The lateral N-channel IGBT transistor (100) according to claim 1, characterized in that at least the interconnect layer (136c) is shunted by a silicide layer of low resistivity.

5. The lateral N-channel IGBT transistor (100) according to claim 1, characterized in that the interconnect layer (136c) is shunted by a metal bridge spanning from drain layer (136a) to base layer (136b).

6. The lateral N-channel IGBT transistor (100) according to claim 1, further provided with a p-type collector contact layer (150) in contact with p-type layer (125b) and oxide isolation layers (310) surrounding the emitter (145) and the collector contact layer (150), and in that the interconnect layer (136c) and base layer (136b) is replaced by n-well layer (130).

7. The lateral N-channel IGBT transistor (100) according to claim 1, characterized in that the IGBT structure is mirrored vis-à-vis an imaginary vertical plane (122) through the emitter.

8. A lateral IGBT transistor comprising a bipolar transistor and an IGFET, where the IGFET can be of conventional type or be of the extended drain type, characterized by:
    a low resistive connection between the drain of the IGFET and the base of the bipolar transistor, and;
    an isolating layer arranged between the IGFET and the bipolar transistor,
    thereby providing latch immunity,
    wherein the lateral IGBT transistor is a lateral p-channel IGBT transistor (200) comprising a bipolar NPN transistor (202) and a p-channel IGFET (201), wherein the lateral p-channel IGBT transistor (200) comprises:
        a semiconductor substrate (115);
        a buried n-layer (220) arranged in the semiconductor sub-strate (115) at least covering the bipolar NPN transistor (202) and at least portion of a drain layer (241a) of the IGFET; and
    wherein the bipolar NPN transistor (202) comprises:
        an n-type collector layer (230b) arranged on top of a portion of the buried n-layer (220) and a portion extending to the upper surface of the semiconductor substrate (115), forming the collector of the bipolar NPN transistor (202);
        a p-type base layer (227b) arranged within the n-type collector layer (230b) and extending to the upper surface of the semiconductor substrate (115), forming the base of the bipolar NPN transistor (202); and
        an n-type emitter layer (245) arranged within base layer (227b) and extending to the upper semiconductor substrate (115), forming the emitter of the bipolar NPN transistor; and
    wherein the p-channel IGFET (201) comprises:
        an n-well (230a) extending from the upper surface of the semiconductor substrate (115) into the semiconductor sub-strate;

a channel layer (226) in vicinity of the upper surface of the semiconductor substrate (115) and arranged under a gate structure (256);

a p-type source layer (240) is forming the source of the p-channel IGFET (201); and a p-type drain layer (241*a*) forming the drain of the p-channel IGFET (201);

the lateral p-channel IGBT transistor (200) characterized by:

a p-well layer (225) adjacent to the p-well (230*a*) of the p-channel IGFET (201) and to the collector layer (230*b*) of the bipolar NPN transistor (202), and wherein the p-type base layer (227*b*) is enclosed by the collector layer (230*b*) and the p-well layer (225) surrounds the collector layer (230*b*) and is in contact with the buried n-layer (220) providing device isolation between IGFET (201) and the NPN bipolar transistor (202); and a low resistive interconnect layer (241*c*) extending from the drain layer (241*a*) to the base layer (241*b*) forming low resistive interconnect and simultaneously providing an ohmic contact to the base layer (227*b*), the low resistive interconnect layer (241*c*) arranged at least partly over the n-well (230*a*), at least partly over the collector layer (230*b*) and at least partly over the p-well layer (225).

9. The lateral P-channel IGBT transistor (200) according to claim 8, characterized in that the semiconductor substrate (115) comprises a buried oxide layer forming an insulating layer (220) that extends over the complete substrate.

10. The lateral P-channel IGBT transistor (200) according to claim 8, characterized in that the interconnect layer (241*c*) is provided with openings to allow contact to the collector layer (230*b*).

11. The lateral P-channel IGBT transistor (200) according to claim 8, characterized in that at least the interconnect layer (241*c*) is shunted by a silicide layer of low resistivity.

12. The lateral P-channel IGBT transistor (100) according to claim 8, characterized in that the interconnect layer (241*c*) is shunted by a metal bridge spanning from drain layer (241*a*) to base layer (241*b*).

13. The lateral P-channel IGBT transistor (100) according to claim 8, further provided with a n-type collector contact layer (250) in contact with n-type layer (230*b*) and oxide isolation layers (310) surrounding the emitter (145) and the collector contact layer (250), and in that the interconnect layer (241*c*) and base layer (241*b*) is replaced by p-well layer (225).

* * * * *